(12) United States Patent
Kato et al.

(10) Patent No.: US 10,626,054 B2
(45) Date of Patent: Apr. 21, 2020

(54) MULTILAYER CERAMIC SUBSTRATE AND METHOD FOR MANUFACTURING MULTILAYER CERAMIC SUBSTRATE

(71) Applicant: Murata Manufacturing Co., Ltd., Nagaokakyo-shi, Kyoto-fu (JP)

(72) Inventors: Tomoki Kato, Nagaokakyo (JP); Sadaaki Sakamoto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 180 days.

(21) Appl. No.: 15/814,676

(22) Filed: Nov. 16, 2017

(65) Prior Publication Data

US 2018/0072627 A1 Mar. 15, 2018

Related U.S. Application Data

(63) Continuation of application No. PCT/JP2016/062449, filed on Apr. 19, 2016.

(30) Foreign Application Priority Data

Jun. 29, 2015 (JP) .................................. 2015-130347

(51) Int. Cl.
| | |
|---|---|
| B32B 15/04 | (2006.01) |
| B32B 17/06 | (2006.01) |
| C04B 35/195 | (2006.01) |
| H05K 3/46 | (2006.01) |
| H05K 1/03 | (2006.01) |
| B32B 18/00 | (2006.01) |
| B32B 1/00 | (2006.01) |
| C04B 35/26 | (2006.01) |

(52) U.S. Cl.
CPC .............. *C04B 35/195* (2013.01); *B32B 1/00* (2013.01); *B32B 18/00* (2013.01);
(Continued)

(58) Field of Classification Search
USPC .................................................. 428/426, 428
See application file for complete search history.

(56) References Cited

U.S. PATENT DOCUMENTS

| | | |
|---|---|---|
| 6,521,069 B1 | 2/2003 | Sugaya et al. |
| 6,696,139 B2 | 2/2004 | Sugaya et al. |
| (Continued) | | |

FOREIGN PATENT DOCUMENTS

| | | |
|---|---|---|
| CN | 101543151 A | 9/2009 |
| CN | 102272072 A | 12/2011 |
| | (Continued) | |

OTHER PUBLICATIONS

International Search Report issued in International Application No. PCT/JP2016/062449, dated Jul. 12, 2016.
(Continued)

*Primary Examiner* — Lauren R Colgan
(74) *Attorney, Agent, or Firm* — Arent Fox LLP (57) ABSTRACT

A multilayer ceramic substrate that includes a laminate having stacked ceramic layers formed of a ceramic material containing a main component, containing 48 to 75% by weight of Si, 20 to 40% by weight of Ba, and 10 to 40% by weight of Al, and an auxiliary component containing at least 2.5 to 20 parts by weight of Mn with respect to 100 parts by weight of the main component, and in the laminate, glass ceramic layers in which the entire or a portion of the thickness thereof exists within 100 μm inside of the laminate as measured from opposed principal surfaces are further stacked.

6 Claims, 6 Drawing Sheets

(52) U.S. Cl.
CPC ....... *C04B 35/2633* (2013.01); *H05K 1/0306* (2013.01); *H05K 3/46* (2013.01); *H05K 3/4688* (2013.01); *C04B 2235/3215* (2013.01); *C04B 2235/3262* (2013.01); *C04B 2237/341* (2013.01); *C04B 2237/56* (2013.01); *C04B 2237/68* (2013.01); *C04B 2237/702* (2013.01); *C04B 2237/704* (2013.01); *H05K 2201/017* (2013.01); *H05K 2201/0175* (2013.01); *H05K 2201/0195* (2013.01)

(56) References Cited

U.S. PATENT DOCUMENTS

| | | | |
|---|---|---|---|
| 2003/0141006 A1 | 7/2003 | Sugaya et al. | |
| 2009/0061178 A1* | 3/2009 | Sugimoto | C03C 14/004 428/210 |
| 2011/0284270 A1 | 11/2011 | Katsube | |
| 2011/0300355 A1* | 12/2011 | Katsube | B32B 18/00 428/210 |

FOREIGN PATENT DOCUMENTS

| | | |
|---|---|---|
| JP | H10-84056 A | 3/1998 |
| JP | 2000-281450 A | 10/2000 |
| JP | 2009-231414 A | 10/2009 |
| JP | 5024064 B2 | 9/2012 |
| JP | 5533674 B2 | 6/2014 |

OTHER PUBLICATIONS

Written Opinion of the International Searching Authority issued in International Application No. PCT/JP2016/062449, dated Jul. 12, 2016.

* cited by examiner

Example 1

Comparative
Example 1

MULTILAYER CERAMIC SUBSTRATE AND METHOD FOR MANUFACTURING MULTILAYER CERAMIC SUBSTRATE

CROSS REFERENCE TO RELATED APPLICATIONS

The present application is a continuation of International application No. PCT/JP2016/062449, filed Apr. 19, 2016, which claims priority to Japanese Patent Application No. 2015-130347, filed Jun. 29, 2015, the entire contents of each of which are incorporated herein by reference.

FIELD OF THE INVENTION

The present invention relates to a multilayer ceramic substrate, and more particularly to a multilayer ceramic substrate which contains sufficient glass component in the vicinity of upper and lower principal surfaces, is hardly cracked, has high flexural strength, and has high electrode bonding strength between a substrate and a surface electrode.

The present invention further relates to a method for manufacturing a multilayer ceramic substrate that is suitable for manufacture of the above-described multilayer ceramic substrate of the present invention.

BACKGROUND OF THE INVENTION

Low Temperature Cofired Ceramic (LTCC) materials are widely used as multilayer ceramic substrate materials. If a low temperature cofired ceramic is used, when a relatively inexpensive and low specific resistant low-melting point metal such as silver or copper is used as an electrode material such as an internal electrode, a surface electrode, or a via electrode, the low temperature cofired ceramic and the low-melting point metal can be co-fired. Therefore, a multilayer ceramic substrate excellent in high-frequency characteristics can be manufactured at low cost.

For example, Patent Document 1 (Japanese Patent No. 5,533,674) discloses a low temperature cofired ceramic material containing a main component, containing 48 to 75% by weight of $SiO_2$, 20 to 40% by weight of BaO, and 5 to 20% by weight of $Al_2O_3$, 2.5 to 5.5 parts by weight of MnO as a sintering aid component with respect to 100 parts by weight of the main component, and other auxiliary components.

As described above, the low temperature cofired ceramic material has an advantage that it can be co-fired with a low melting point metal such as silver or copper; however, it also has a problem that a substrate shrinks greatly in the planar direction during firing.

In view of this, in the method for manufacturing a multilayer ceramic substrate that is disclosed in Patent Document 2 (Japanese Patent No. 5,024,064), constraining layers are inserted between ceramic layers each formed of a low temperature cofired ceramic material to form a laminate, and shrinkage in the planar direction of a substrate is suppressed by firing the laminate. Patent Document 2 discloses that the constraining layer uses, for example, $Al_2O_3$ (alumina), $ZrO_2$ (zirconia), or the like (see paragraph (0035)). Patent Document 2 further discloses that the constraining layer may contain a glass component (see paragraph (0058)). The constraining layer remains in the laminate even after the multilayer ceramic substrate is completed.

According to the method for manufacturing a multilayer ceramic substrate disclosed in Patent Document 2, shrinkage in the planar direction of the substrate can be suppressed. However, the manufactured multilayer ceramic substrate has a structure in which ceramic layers and constraining layers formed of two types of materials exhibiting different shrinkage behaviors are stacked over the entire thickness direction of the substrate, so that there have been problems that an amount of warp of the substrate is large, flexural strength is low, and electrode bonding strength between the substrate and a surface electrode is low.

Thus, in order to solve this problem, Patent Document 3 (Japanese Patent Application Laid-Open No. 10-84056) discloses a method for manufacturing a multilayer ceramic substrate in which, while a laminate itself constituting the multilayer ceramic substrate has a multilayer structure of low temperature cofired ceramic layers, the laminate is fired so as to be vertically sandwiched between constraining layers with pressure. Patent Document 3 discloses that the constraining layer uses, for example, MgO, $Al_2O_3$, $ZrO_2$, or the like (see paragraph (0020)). The constraining layer is removed from a surface of the multilayer ceramic substrate after firing.

The multilayer ceramic substrate manufactured by the method disclosed in Patent Document 3 solves the problem of the multilayer ceramic substrate manufactured by the method disclosed in Patent Document 2. That is, according to the method disclosed in Patent Document 3, a ceramic portion of the substrate is formed of one kind of low temperature cofired ceramic material. Thus, it is possible to solve the problems of the method disclosed in Patent Document 2, that the amount of warp is large, the flexural strength is low, and the electrode bonding strength between the substrate and the surface electrode is low, due to the fact that the substrate is formed by the low temperature cofired ceramic layer and the constraining layer exhibiting different shrinkage behaviors.

Patent Document 1: Japanese Patent No. 5,533,674
Patent Document 2: Japanese Patent No. 5,024,064
Patent Document 3: Japanese Patent Application Laid-Open No. 10-84056

SUMMARY OF THE INVENTION

However, the multilayer ceramic substrate manufactured by the method disclosed in Patent Document 3 has a problem that the flexural strength is low and the electrode bonding strength with the surface electrode is low due to another reason.

That is, in the method for the multilayer ceramic substrate disclosed in Patent Document 3, there has been a problem that during firing, the constraining layers vertically sandwiching the laminate with pressure suck a glass component from the laminate formed of the low temperature cofired ceramic material. When the glass component is sucked from the upper and lower principal surfaces of the laminate, the glass component becomes insufficient in the vicinity of the upper and lower principal surfaces of the laminate, and compressive stress cannot be obtained, so that there have been problems that cracks are likely to occur, the flexural strength of the substrate decreases, and the electrode bonding strength between the substrate and the surface electrode decreases.

The present invention has been made to solve the above-described conventional problems, and as a means therefor, the multilayer ceramic substrate of the present invention includes a laminate in which an internal electrode is disposed between predetermined layers and a plurality of ceramic layers are stacked. In this multilayer ceramic substrate, the ceramic layer is formed of a ceramic material containing a main component, containing 48 to 75% by weight of Si, 20 to 40% by weight of Ba, and 10 to 40% by weight of Al, and an auxiliary component containing at least 2.5 to 20 parts by weight of Mn with respect to 100 parts by weight of the main component. A first glass ceramic layer in which at least a portion of a thickness thereof exists within 100 μm inside of the laminate as measured from a principal surface of the laminate. In the above description, "inside of the laminate" means a portion excluding a surface portion of the principal surface of the laminate. Further, in the above description, 100 μm is a distance in a completed laminate (laminate after firing). The thickness of the laminate is calculated from a total thickness of the ceramic layer and the glass ceramic layer by excluding the thickness of the very small internal electrode.

The number of the first glass ceramic layers is preferably not more than six. This is because if the total number of the glass ceramic layers in the laminate is more than six, insulation resistance of the ceramic layer may decrease.

The number of the first glass ceramic layers may be one or two, for example. In this case, since the ratio of the glass ceramic layer to the entire laminate is extremely small, even when the laminate has a multilayer structure of the ceramic layer and the glass ceramic layer exhibiting different shrinkage behaviors, the substrate is not warped, the flexural strength is not reduced, or the electrode bonding strength between the substrate and the surface electrode is not reduced.

The laminate may not include a glass ceramic layer in which the entire thickness exists in a region away from one of the principal surfaces by more than 100 μm and away from the other principal surface by more than 100 μm. In this case, since the glass ceramic layer does not exist at the center portion of the laminate, even when the ceramic layer and the glass ceramic layer exhibiting different shrinkage behaviors are stacked, the substrate is not warped, the flexural strength is not reduced, or the electrode bonding strength between the substrate and the surface electrode is not reduced.

Alternatively, although the laminate may include a second glass ceramic layer in which the entire thickness exists in a region away from one of the principal surfaces by more than 100 μm and away from the other principal surface by more than 100 μm, a total number of the first glass ceramic layers and the second glass ceramic layers is preferably not more than six. This is because if the total number of the glass ceramic layers in the laminate is more than six, insulation resistance of the ceramic layer may decrease.

On the other hand, the glass ceramic layer includes two layers of a first glass ceramic layer close to one of the principal surfaces of the laminate and a second glass ceramic layer close to the other principal surface of the laminate, and glass concentration of the ceramic layer stacked between one of the principal surfaces of the laminate and the first glass ceramic layer and the ceramic layer stacked between the other principal surface of the laminate and the second glass ceramic layer may be higher than the glass concentration of the ceramic layer stacked between the first glass ceramic layer and the second glass ceramic layer. In this case, since the ceramic layers in the vicinity of the upper and lower principal surfaces of the substrate contain sufficient glass component, a thermal expansion coefficient in the vicinity of the upper and lower principal surfaces of the substrate is lower than the thermal expansion coefficient inside the substrate. As a result, compressive stress acts on each of the upper and lower principal surfaces of the substrate, so that cracks hardly occur in the substrate, the flexural strength of the substrate increases, and the electrode bonding strength between the substrate and the surface electrode increases.

A method for manufacturing a multilayer ceramic substrate according to the present invention is a method for manufacturing a multilayer ceramic substrate which includes a laminate of a plurality of ceramic layers having an internal electrode disposed between predetermined layers, in which the ceramic layer is formed of a ceramic material containing a main component, containing 48 to 75% by weight of Si, 20 to 40% by weight of Ba, and 10 to 40% by weight of Al, and an auxiliary component containing at least 2.5 to 20 parts by weight of Mn with respect to 100 parts by weight of the main component, and in which, in the laminate, a first glass ceramic layer in which at least a portion of a thickness exists within 100 μm inside of the laminate as measured from a principal surface thereof. The method includes a step (a) of preparing the ceramic green sheet used for forming the ceramic layer, a step (b) of applying a glass ceramic slurry onto a principal surface of predetermined one of the ceramic green sheets to form a glass ceramic layer, a step (c) of applying a conductive paste onto a principal surface of predetermined one of at least one of the ceramic green sheet having no glass ceramic layer and the ceramic green sheet on which the glass ceramic layer is formed, such that the conductive paste has a predetermined shape, to form an internal electrode layer, a step (d) of stacking the ceramic green sheets, including the glass ceramic layer and ones with the conductive paste applied thereon, in a predetermined order to produce an unfired laminate, a step (e) of sandwiching both principal surfaces of the unfired laminate, obtained in the step (d), between a pair of constraining layers and pressure-bonding the unfired laminate, a step (f) of, after the step (e), firing the unfired laminate in a state where pressure is applied to the unfired laminate, to produce the laminate, and a step of, after the step (f), removing the constraining layers from both principal surfaces of the laminate. In the above description, "inside of the laminate" means a portion excluding a surface portion of the principal surface of the laminate. Further, in the above description, 100 μm is a distance in a completed laminate (laminate after firing).

When a constraining-layer green sheet is used as the constraining layer, its thickness is preferably not less than 10 μm. If the thickness is less than 10 μm, cracks may occur in the multilayer ceramic substrate.

On the other hand, the thickness of the glass ceramic layer before firing is preferably not less than 1 μm and not more than 30 μm. If the thickness is less than 1 μm, a supply amount of a glass component may be insufficient. On the other hand, if the thickness is more than 30 μm, a ratio of the thickness of a glass ceramic layer 3 to the total thickness of a laminate 1 becomes too large, and the flexural strength and the electrode bonding strength may decrease.

In the multilayer ceramic substrate of the present invention, the glass component is supplied from the first glass ceramic layer, and the ceramic layers in the vicinity of the upper and lower principal surfaces of the substrate contain sufficient glass component; therefore, the thermal expansion coefficient in the vicinity of the upper and lower principal surfaces of the substrate is lower than the thermal expansion coefficient inside the substrate. As a result, the compressive stress acts on each of the upper and lower principal surfaces of the substrate, so that cracks hardly occur in the substrate, the flexural strength of the substrate is high, and the electrode bonding strength between the substrate and the surface electrode is high.

According to the method for manufacturing a multilayer ceramic substrate of the present invention, the glass component is supplied from the first glass ceramic layer, and the ceramic layers in the vicinity of the upper and lower principal surfaces of the substrate can contain sufficient glass component; therefore, in the manufactured multilayer ceramic substrate, the thermal expansion coefficient in the vicinity of the upper and lower principal surfaces of the substrate is lower than the thermal expansion coefficient inside the substrate. As a result, in the multilayer ceramic substrate manufactured by the method of the present invention, the compressive stress acts on each of the upper and lower principal surfaces of the substrate, so that cracks hardly occur in the substrate, the flexural strength of the substrate is high, and the electrode bonding strength between the substrate and the surface electrode is high.

DETAILED DESCRIPTION OF THE PREFERRED EMBODIMENTS OF THE INVENTION

Hereinafter, embodiments for carrying out the present invention will be described with reference to the drawings. Each embodiment exemplifies the embodiment of the present invention, and the present invention is not limited to contents of the embodiments. In addition, the contents described in different embodiments may be combined and implemented, and the implementation contents in that case are also included in the present invention. The drawings are provided to help the understanding of the embodiments, and there are cases where the drawings are not necessarily illustrated strictly. For example, there are cases where the constituent elements described in the specification are omitted in the drawings, or the number of the constituent elements and the number of layers are changed in the drawings. The ratios of dimensions of the illustrated constituent elements or the ratio of dimensions between the constituent elements may not correspond to the ratios of dimensions of those described in the specification.

EMBODIMENTS

Figure 1:
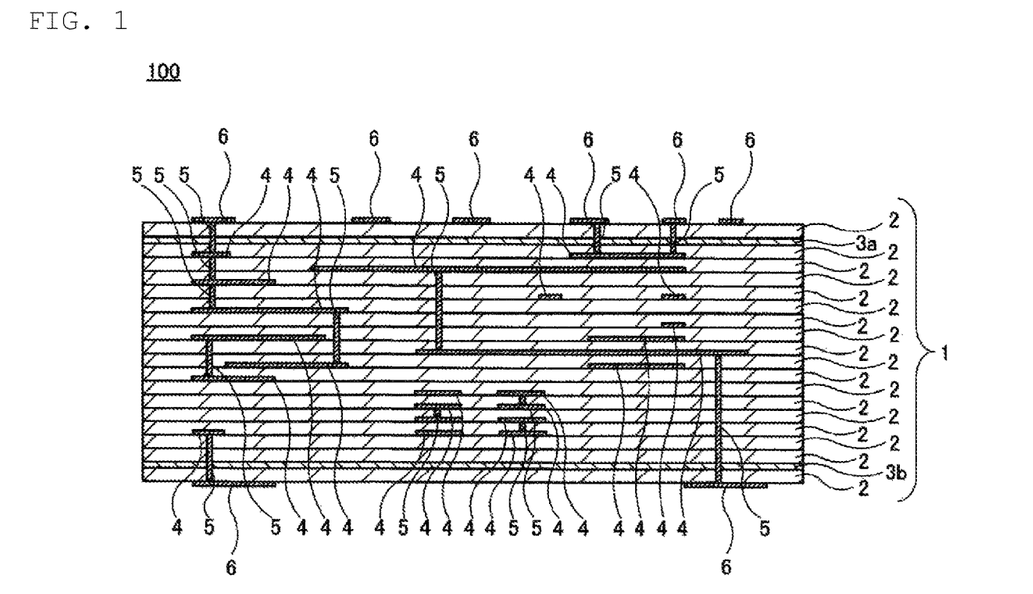
FIG. 1 is a cross-sectional view showing a ceramic multilayer substrate 100 according to a first embodiment.

FIG. 1 shows a multilayer ceramic substrate 100 according to an embodiment of the present invention, and is a cross-sectional view of the multilayer ceramic substrate 100.

The multilayer ceramic substrate 100 includes a laminate 1.

The laminate 1 has a multilayer structure of a plurality of ceramic layers 2, two glass ceramic layers 3a and 3b, and a plurality of internal electrodes 4.

Each of the ceramic layers 2 is formed of a fired ceramic green sheet produced using a ceramic material having a main component containing 48 to 75% by weight of $SiO_2$, 20 to 40% by weight of BaO, and 5 to 20% by weight of $Al_2O_3$, and an auxiliary component containing at least 2.5 to 20 parts by weight of MnO with respect to 100 parts by weight of the main component.

The internal electrode 4 having a predetermined shape is stacked between predetermined layers of the ceramic layers 2. In the present embodiment, although the internal electrode 4 is not stacked between the ceramic layer 2 and the glass ceramic layer 3a or 3b, the internal electrode 4 may be stacked between the ceramic layer 2 and the glass ceramic layer 3a or 3b.

In the ceramic layer 2, a via electrode 5 is formed at a predetermined position penetrating the front and back surfaces as necessary. The via electrode 5 serves to establish electrical conduction between the front and back surfaces of the ceramic layer 2.

The glass ceramic layer 3a is stacked such that the entire or a portion of the thickness thereof exists within 100 μm from an upper principal surface of the laminate 1.

The glass ceramic layer 3b is stacked such that the entire or a portion of the thickness thereof exists within 100 μm from a lower principal surface of the laminate 1. A distance from the principal surface to one of the glass ceramic layers 3a and 3b is the distance after firing the laminate 1.

The glass ceramic layers 3a and 3b are, for example, formed of the fired ceramic green sheet described above and coated with a glass ceramic slurry produced using a material containing 60 to 40 parts by weight of a glass component mainly composed of $BaO-Al_2O_3-SiO_2-B_2O_3-CaO$ with respect to 40 to 60 parts by weight of $Al_2O_3$. The glass ceramic layers 3a and 3b may be a fired glass ceramic green sheet produced using a glass ceramic slurry in place of applying the glass ceramic slurry onto the ceramic green sheet.

The glass ceramic layer 3a is stacked in order to supply the glass component to the ceramic layer 2 stacked on the upper side of the laminate 1 itself and allow the vicinity of the upper principal surface of the laminate 1 to contain sufficient glass component. The glass ceramic layer 3b is stacked in order to supply the glass component to the ceramic layer 2 stacked on the lower side of the laminate 1 itself and allow the vicinity of the upper principal surface of the laminate 1 to contain sufficient glass component.

As described above, each of the glass ceramic layers 3a and 3b is stacked such that the entire or a portion of the thickness exists within 100 μm from either of the principal surfaces of the laminate 1. The reason for making the distance within 100 μm is because the glass component may not be sufficiently supplied to the vicinity of the principal surface of the laminate 1 when the glass ceramic layers 3a and 3b are stacked away from the principal surfaces of the laminate 1 by more than 100 In the present embodiment, the glass ceramic layer 3a is stacked near the upper principal surface, and the glass ceramic layer 3b is stacked near the lower principal surface; however, if the thickness of the laminate 1 is less than around 200 μm, only one of the glass ceramic layers may be provided.

In the glass ceramic layers 3a and 3b, the via electrode 5 is formed at a predetermined position penetrating the front and back surfaces as necessary.

As necessary, surface electrodes 6 having a predetermined shape are formed at predetermined positions on both principal surfaces of the laminate 1.

The internal electrode 4, the via electrode 5, and the surface electrode 6 are, for example, formed of a fired conductive paste mainly composed of a low melting point metal, such as silver or copper, which can be co-fired with the ceramic layer 2. Since the low melting point metal such as silver or copper is relatively inexpensive and has low specific resistance, a multilayer ceramic substrate excellent in high frequency characteristics can be manufactured at low cost by using such a low melting point metal. However, the low melting point metal is not necessarily used in the internal electrode 4, the via electrode 5, and the surface electrode 6, and a high melting point metal may be used.

In the laminate 1, a required electrical wiring is formed by the internal electrode 4 and the via electrode 5. In some cases, an inductor and a capacitor are formed by the internal electrode 4 and the via electrode 5. Further, in some cases, a resistor film is provided between the ceramic layers 2 in the laminate 1, or an electronic component element is incorporated in the laminate 1.

When an electronic component is mounted on the multilayer ceramic substrate 100 having the above-described structure, an electronic component module can be produced.

Figure 2:
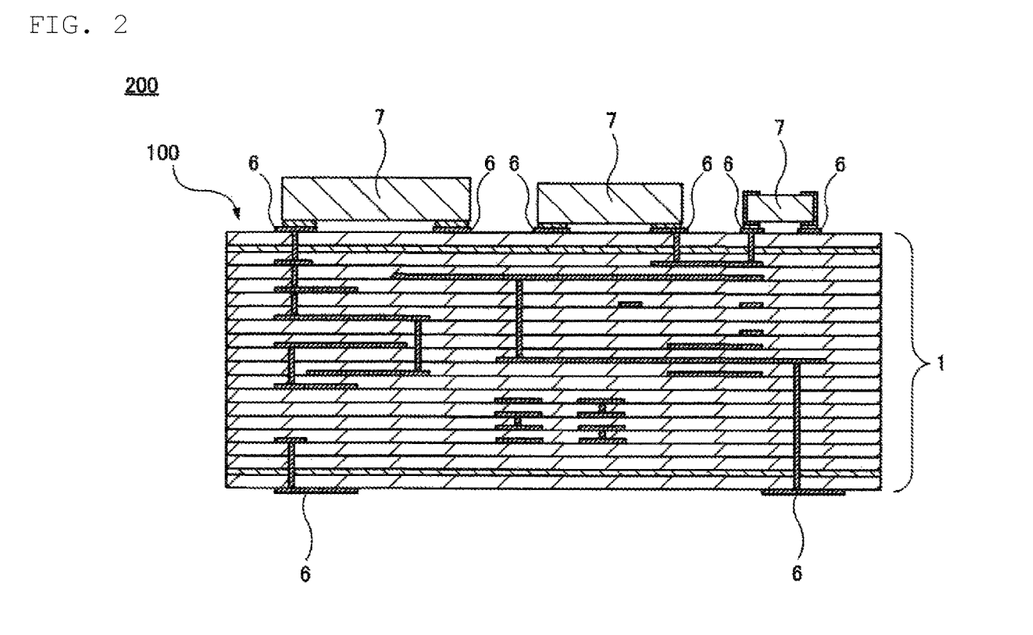
FIG. 2 is a cross-sectional view showing an electronic module 200 produced using the ceramic multilayer substrate 100.

FIG. 2 shows as an example an electronic component module 200 using the multilayer ceramic substrate 100, and is a cross-sectional view of the electronic component module 200.

In the electronic component module 200, a plurality of electronic components 7 are mounted on the surface electrodes 6 formed on the upper principal surface of the multilayer ceramic substrate 100. The surface electrode 6 formed on the lower principal surface of the multilayer ceramic substrate 100 is used as an electrode for mounting the electronic component module 200 on a substrate or the like.

FIGS. 3 to 7 show an example of a method for manufacturing the multilayer ceramic substrate 100.

Figure 3:
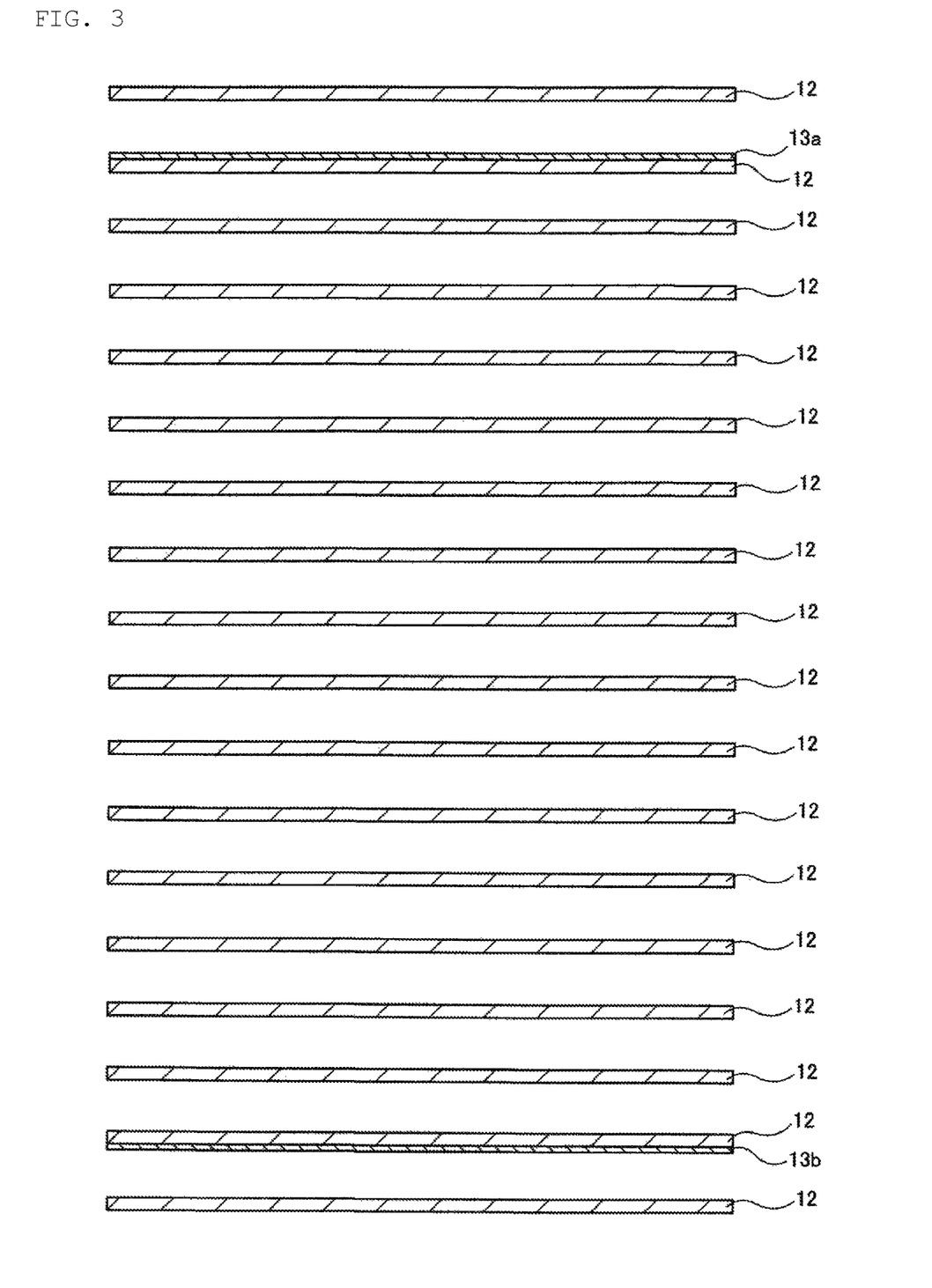
FIG. 3 is a cross-sectional view showing a step performed in an example of a method for manufacturing the ceramic multilayer substrate 100.

First, a plurality of ceramic green sheets 12 for forming the ceramic layers 2 were produced.

Specifically, first, although not shown, powders of $SiO_2$, $BaCO_3$, $Al_2O_3$, $Zr_2O$, $MnCO_3$, and $CeO_2$ were prepared as starting materials.

Then, each of the powders of $SiO_2$, $BaCO_3$, $Al_2O_3$, and $Zr_2O$ was blended such that after calcination, the $SiO_2$ content was 57.0% by weight, the BaO content was 31.0% by weight, and the $Al_2O_3$ content was 12.0% by weight, and, at the same time, the $ZrO_2$ content was 0.5 parts by weight with respect to a total of 100 parts by weight of $SiO_2$, BaO, and $Al_2O_3$, and subsequently wet-mixed with pure water by a ball mill. After mixing, the mixture was evaporated and dried to obtain a mixed material powder.

Then, the obtained mixed material powder was calcined in air at a temperature of 840° C. for 2 hours to obtain a calcined powder.

Then, each of the powders of $MnCO_3$ and $CeO_2$ was blended with the obtained calcined powder such that after firing, the MnO content was 4.0 parts by weight, and the $CeO_2$ content was 3.0 parts by weight with respect to a total of 100 parts by weight of $SiO_2$, BaO, and $Al_2O_3$, and subsequently wet-mixed with an organic solvent by a ball mill to obtain a wet mixture.

Then, predetermined amounts of a butyral resin and a plasticizer (DOP) were respectively added to the obtained wet mixture and mixed, thus obtaining a ceramic slurry.

Then, by use of the obtained ceramic slurry, a ceramic green sheet having a thickness of 20 μm was produced by a doctor blade method. Subsequently, the obtained ceramic green sheet was cut to a desired size, and a plurality of ceramic green sheets 12 were obtained. In the present embodiment, 50 ceramic green sheets were obtained.

Simultaneously with the above-described production of the ceramic green sheets for forming the ceramic layers 2, a glass ceramic slurry for forming the glass ceramic layers 3a and 3b was produced.

Specifically, first, an $Al_2O_3$ powder and a glass powder mainly composed of BaO—$Al_2O_3$—$SiO_2$—$B_2O_3$—CaO were prepared.

Then, 50 parts by weight of the glass powder was blended with 50 parts by weight of the $Al_2O_3$ powder, and subsequently the butyral resin and the plasticizer were added and mixed to produce a glass ceramic slurry.

Then, one of glass ceramic layers 13a and 13b having a thickness of 4 μm was formed on each of the entire two principal surfaces of the ceramic green sheet 12 by a doctor blade method using the glass ceramic slurry.

FIG. 3 shows the ceramic green sheets 12 having no glass ceramic layer and the ceramic green sheets 12 on which one of the glass ceramic layers 13a and 13b is formed, in the order in which the ceramic green sheets 12 are stacked in an unfired laminate 11 to be described later.

As can be seen from FIG. 3, except for a constraining-layer green sheet 18 to be described later (hereinafter, the order of the stacked layers is described excluding the constraining-layer green sheet 18), in the unfired laminate 11, the respective plain ceramic green sheets 12 are stacked on the uppermost layer, between the third layer from the top and the third layer from the bottom, and the lowermost layer. The ceramic green sheet 12 having the glass ceramic layer 13a on its upper surface is stacked on the second layer from the top, and the ceramic green sheet 12 having the glass ceramic layer 13b on its lower surface is stacked on the second layer from the bottom. In the present embodiment, although the total number of the ceramic green sheets 12 is set to 50, the number of the ceramic green sheets 12 is omitted for the sake of clarity in FIG. 3 (the same applies to the other drawings).

Figure 4:
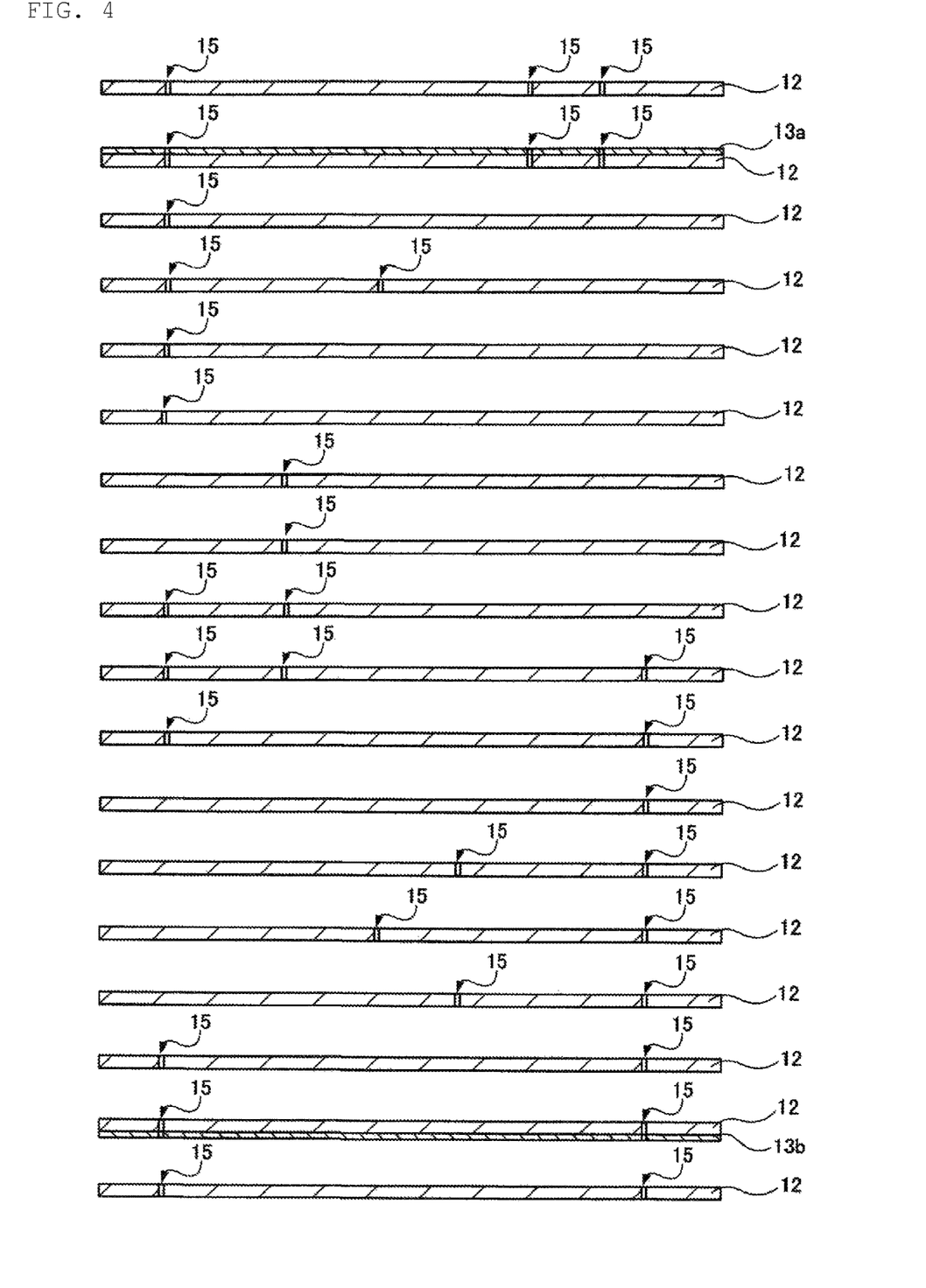
FIG. 4 is a continuation of FIG. 3 and is a cross-sectional view showing a step performed in an example of the method for manufacturing the ceramic multilayer substrate 100.

Then, as shown in FIG. 4, holes 15 for forming the via electrodes 5 were formed by using a laser processing machine, a punching machine, or the like in the ceramic green sheets 12 having no glass ceramic layer and the ceramic green sheets 12 on which the glass ceramic layers 13a and 13b were formed.

In parallel with the formation of the hole 15, a conductive paste mainly composed of a Cu powder was prepared. The conductive paste may be mainly composed of Ag or the like, instead of Cu.

Figure 5:
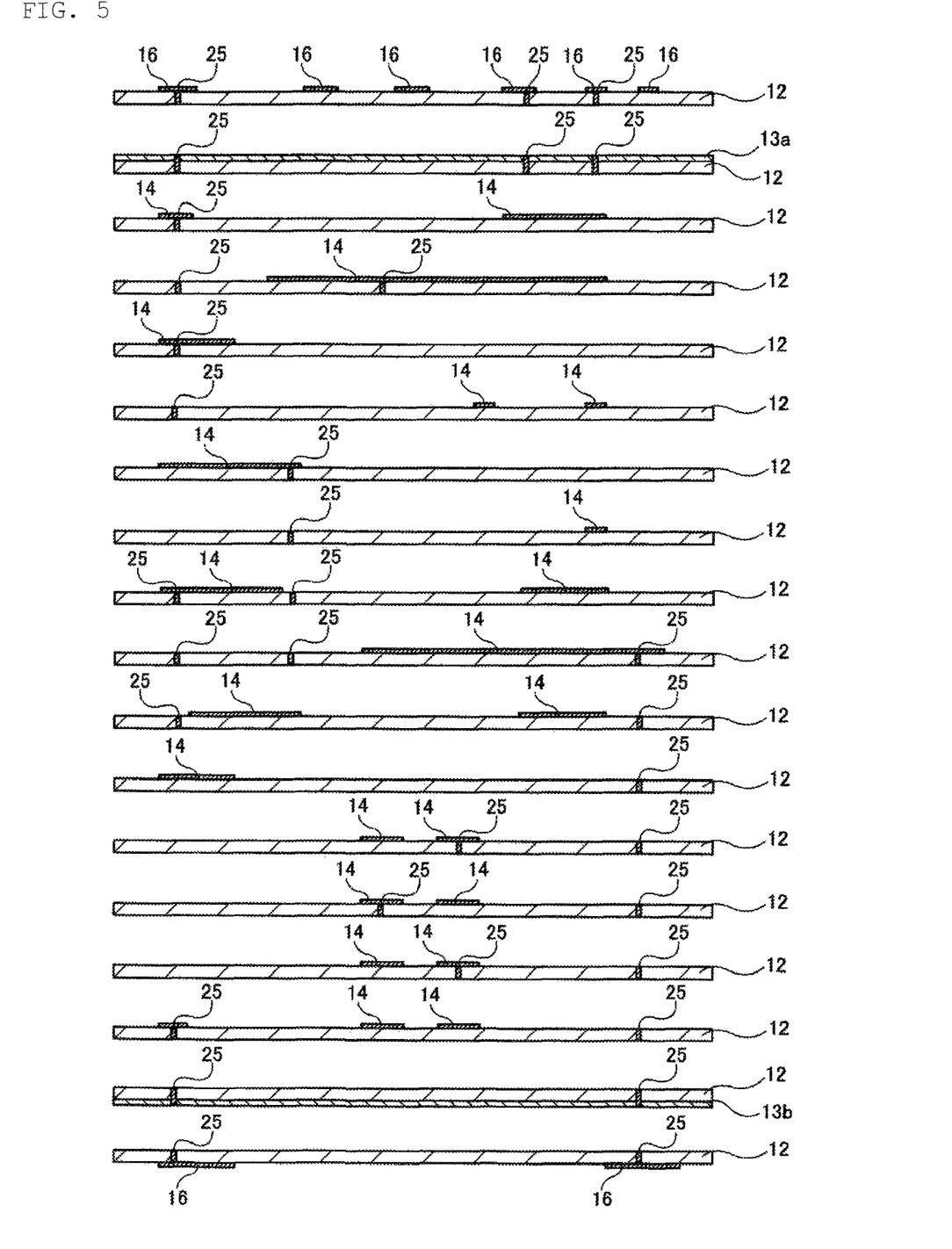
FIG. 5 is a continuation of FIG. 4 and is a cross-sectional view showing a step performed in an example of the method for manufacturing the ceramic multilayer substrate 100.

Then, as shown in FIG. 5, the conductive paste was applied by screen printing or the like onto the ceramic green sheets 12 having no glass ceramic layer and the ceramic green sheets 12 on which the glass ceramic layers 13a and 13b were formed.

As a result, a conductive paste film 16 to serve as the surface electrode 6 after firing was formed on the upper principal surface of the ceramic green sheet 12, which is stacked on the uppermost layer in the unfired laminate 11, so as to have a desired shape, and a conductive paste 25 for forming the via electrode 5 was filled in the hole 15 formed in this ceramic green sheet 12.

Further, the conductive paste 25 for forming the via electrode 5 was filled in the hole 15 formed in the ceramic green sheet 12, which was stacked on the second layer from the top in the unfired laminate 11 and on which the glass ceramic layer 13a was formed.

On the other hand, as necessary, a conductive paste film 14 to serve as the internal electrode 4 after firing was formed on the upper principal surface of the ceramic green sheet 12, which is stacked between the third layer from the top and the third layer from the bottom in the unfired laminate 11 and having no glass ceramic layer, so as to have a desired shape, and the conductive paste 25 for forming the via electrode 5 was filled in the hole 15 formed in this ceramic green sheet 12.

Further, the conductive paste 25 for forming the via electrode 5 was filled in the hole 15 formed in the ceramic green sheet 12 which was stacked on the second layer from the bottom in the unfired laminate 11 and on which the glass ceramic layer 13b was formed.

Further, the conductive paste film 16 to serve as the surface electrode 6 after firing was formed on the lower principal surface of the ceramic green sheet 12, which is disposed on the lowermost layer in the unfired laminate 11, and the conductive paste 25 for forming the via electrode 5 was filled in the hole 15 formed in this ceramic green sheet 12.

Figure 6A:
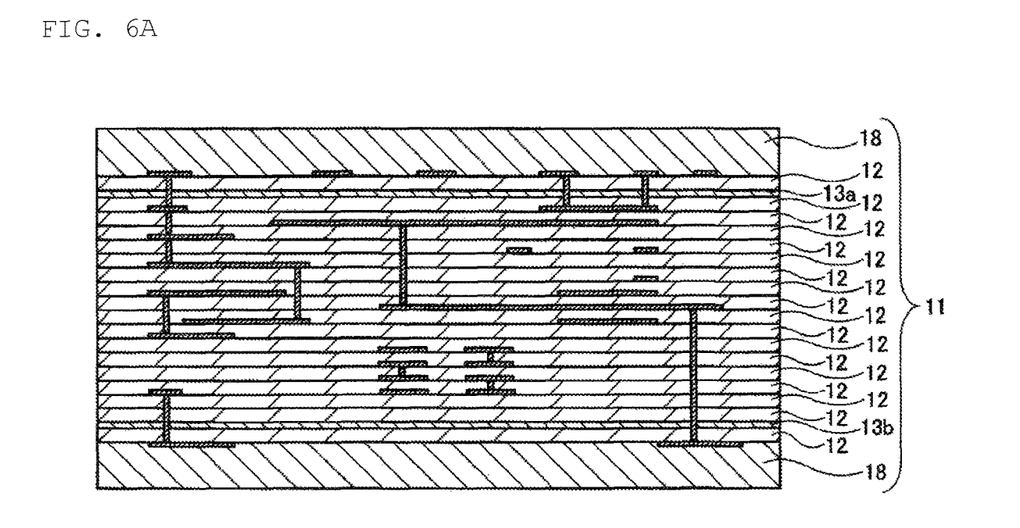
FIGS. 6A and 6B are a continuation of FIG. 5, and FIGS. 6A and 6B are each a cross-sectional view showing a step performed in an example of the method for manufacturing the ceramic multilayer substrate 100.

Then, as shown in FIG. 6A, the ceramic green sheet 12 having no glass ceramic layer, the ceramic green sheets 12 on which the glass ceramic layers 13a and 13b were formed, and a pair of the constraining-layer green sheets 18, 18 as the constraining layers were stacked in a desired order and pressurized to produce the unfired laminate 11. In this state, the unfired laminate 11 was pressure-bonded vertically to form a pressure-bonded body.

For the constraining-layer green sheets 18, 18, a ceramic green sheet mainly composed of $ZrO_2$, $Al_2O_3$, MgO or the like can be used, for example.

Figure 6B:
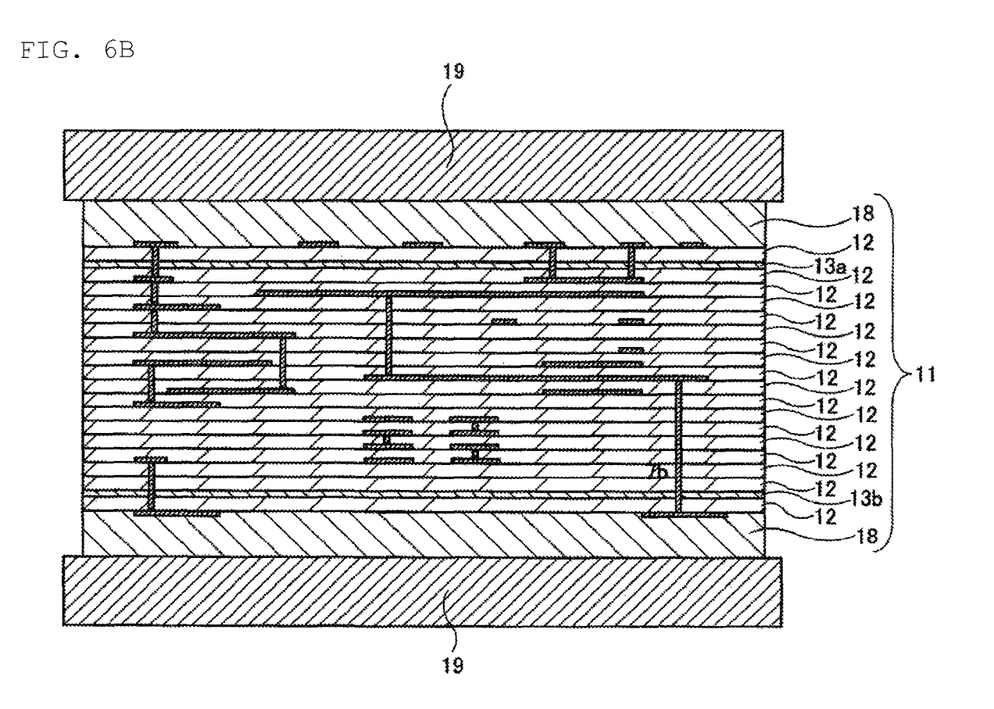

Then, as shown in FIG. 6B, the unfired laminate 11 was further vertically sandwiched between a pair of pressing jigs 19, 19.

Subsequently, the unfired laminate 11 was fired in a state where pressure was applied to the constraining-layer green sheets 18, 18 by the pressing jigs 19, 19. The applied pressure was 10 kgf/cm². The firing atmosphere was a reducing atmosphere. The firing temperature was 980° C.

During firing, although the glass component is absorbed by the constraining-layer green sheets 18, 18 from each of the ceramic green sheets 12 stacked on the uppermost and lowermost layers, in the present embodiment, the glass component is supplied from the glass ceramic layer 13a to the ceramic green sheet 12 stacked on the uppermost layer, and the glass component is supplied from the glass ceramic layer 13b to the ceramic green sheet 12 stacked on the lowermost layer, so that the ceramic green sheets 12 stacked on the uppermost and lowermost layers are fired while containing sufficient glass component.

Figure 7:
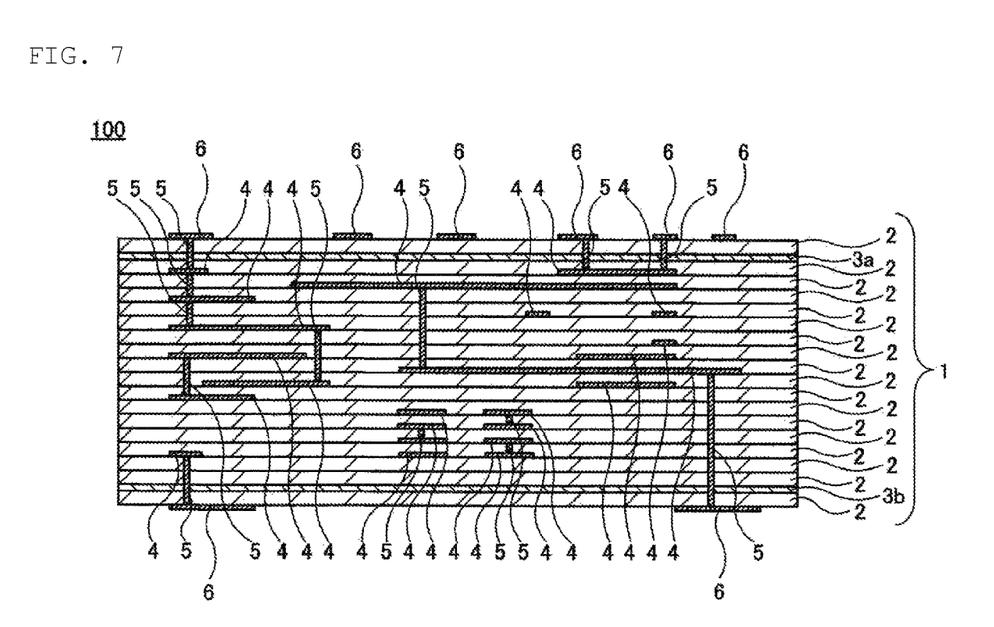
FIG. 7 is a continuation of FIG. 6B and is a cross-sectional view showing a step performed in an example of the method for manufacturing the ceramic multilayer substrate 100.

Then, as shown in FIG. 7, after the entirety was naturally cooled, the pressing jigs 19, 19 were removed, and the constraining layers (constraining-layer green sheets 18, 18) on the upper and lower principal surfaces of the fired laminate 1 were removed.

By firing, the ceramic green sheet 12 having a thickness of 20 μm was changed to the ceramic layer 2 having a thickness of 10 μm. Similarly, by firing, the glass ceramic layers 13a and 13b having a thickness of 4 μm were changed to the glass ceramic layers 3a and 3b having a thickness of 2 μm.

Finally, although not shown, on surfaces of the surface electrodes 6 formed on both the principal surfaces of the laminate 1, a Ni plating film as a first layer and an Au plating film as a second layer were formed by electrolytic plating, thus completing the ceramic multilayer substrate 100.

In the multilayer ceramic substrate 100 according to the present embodiment, since the glass component is supplied from the glass ceramic layers 3a, 3b (glass ceramic layers 13a, 13b), the ceramic layers 2 in the vicinity of the upper and lower principal surfaces of the laminate contain sufficient glass component. Thus, a thermal expansion coefficient in the vicinity of the upper and lower principal surfaces of the multilayer ceramic substrate 100 is lower than the thermal expansion coefficient inside the laminate 1. As a result, since compressive stress acts on each of the upper and lower principal surfaces of the multilayer ceramic substrate 100, cracks hardly occur in the multilayer ceramic substrate 100, flexural strength is high, and electrode bonding strength with the surface electrode is high.

The embodiment of the present invention has been described above. However, the present invention is not limited to these contents, and various modifications can be made in accordance with the gist of the invention.

For example, in the embodiment, although the two glass ceramic layers 3a and 3b are formed in the laminate 1, the number of the glass ceramic layers is arbitrary, and when the thickness of the laminate 1 is less than around 100 μm, the glass component can be supplied to both principal surface sides of the laminate 1 by a single glass ceramic layer.

The material and the thickness of the glass ceramic layers 3a and 3b are also arbitrary, and are not limited to the contents described above.

The number and the thickness of the ceramic layers 2 are also arbitrary, and are not limited to the contents described above.

Although another glass ceramic layer (second glass ceramic layer) may be further stacked between the glass ceramic layer 3a and the glass ceramic layer 3b, the total number of the glass ceramic layers in the laminate 1 is preferably not more than six. If the total number is more than six, insulation resistance of the ceramic layer may decrease.

In order to confirm the effectiveness of the present invention, the following experiments were conducted.

Experimental Example 1

A multilayer ceramic substrate according to Example 1 and a multilayer ceramic substrate according to Comparative Example 1 were produced in the following manner.

First, a plurality of the ceramic green sheets 12, the glass ceramic slurry, and a plurality of the constraining-layer green sheets 18 used in the embodiment were prepared.

The ceramic green sheet 12 had a length of 50 mm, a width of 50 mm, and a thickness of 20 μm. The constraining-layer green sheet 18 had a length of 50 mm, a width of 50 mm, and a thickness of 100 μm.

Then, the glass ceramic slurry was applied onto the entire surface of one of the principal surfaces of the ceramic green sheet 12 by a doctor blade method to form a glass ceramic layer 13 having a thickness of 4 μm.

In order to manufacture the multilayer ceramic substrate according to Example 1, the constraining-layer green sheet 18 was stacked on the lowermost layer. Then, 49 plain ceramic green sheets 12 were stacked thereon. Then, the ceramic green sheet 12 having the glass ceramic layer 13 was stacked thereon such that the glass ceramic layer 13 faces downward. Finally, the constraining-layer green sheet 18 was stacked thereon to produce an unfired laminate according to Example 1.

Then, the unfired laminate according to Example 1 was fired under the same conditions as in the embodiment while being vertically pressurized, thus obtaining the multilayer ceramic substrate according to Example 1.

On the other hand, in order to manufacture the multilayer ceramic substrate according to Comparative Example 1, the constraining-layer green sheet 18 was stacked on the lowermost layer. Then, 50 plain ceramic green sheets 12 were stacked thereon. Finally, the constraining-layer green sheet 18 was stacked thereon to produce an unfired laminate according to Comparative Example 1.

Then, the unfired laminate according to Comparative Example 1 was fired under the same conditions as in Embodiment 1 while being vertically pressurized, thus obtaining the multilayer ceramic substrate according to Comparative Example 1.

Figure 8:
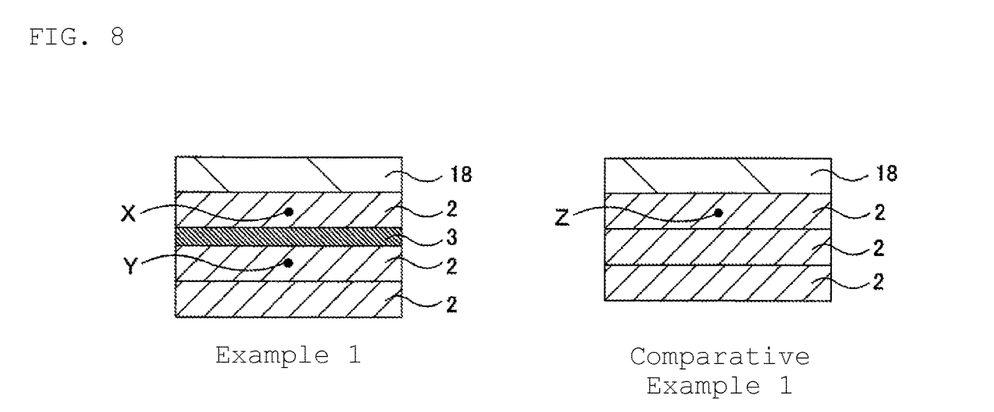
FIG. 8 is cross-sectional view of a main portion of each of a multilayer ceramic substrate according to Example 1 and a multilayer ceramic substrate according to Comparative Example 1 in Experimental Example 1.

FIG. 8 shows the multilayer ceramic substrate according to Example 1 and a multilayer ceramic substrate according to Comparative Example 2. However, FIG. 8 is a cross-sectional view of a main portion of each multilayer ceramic substrate and shows only an upper layer portion of each multilayer ceramic substrate.

In the multilayer ceramic substrate according to Example 1, the constraining layer (constraining-layer green sheet 18) is stacked as the uppermost layer, the ceramic layer 2 is stacked as the second layer from the top, the glass ceramic layer 3 is stacked as the third layer from the top, and a plurality of the ceramic layers 2 are stacked as the fourth layer from the top and layers below this layer.

On the other hand, in the multilayer ceramic substrate according to Comparative Example 1, the constraining layer (constraining-layer green sheet 18) is stacked as the uppermost layer, and a plurality of the ceramic layers 2 are stacked as the second layer from the top and layers below this layer.

Then, for a point X of the ceramic layer 2 as the second layer from the top and a point Y of the ceramic layer 2 as the fourth layer from the top in the multilayer ceramic substrate according to Example 1, and a point Z of the ceramic layer 2 as the second layer from the top in the multilayer ceramic substrate according to Comparative Example 1, the intensity of CaO was measured by XRD analysis. CaO is contained in $BaO$—$Al_2O_3$—$SiO_2$—$B_2O_3$—$CaO$ which is a glass component of the glass ceramic layer 13 but not contained in the ceramic green sheet 12.

Table 1 shows the intensity ratios of CaO at the points X, Y and Z. (While the intensity at the point X is 1.0, the intensities at the points Y and Z are expressed as ratios.)

TABLE 1

| | Measurement point in FIG. 8 | CaO intensity ratio |
|---|---|---|
| Example 1 | X | 1.0 |
| | Y | 0.2 |
| Comparative Example 1 | Z | 0.0 |

As can be seen from Table 1, the CaO intensity at the point Y is lower than the CaO intensity at the point X. The CaO intensity at the point X in Comparative Example 1 was 0.0.

This shows that when the unfired laminate is fired, the constraining-layer green sheet 18 as the uppermost layer absorbs the glass component from the ceramic green sheet 12 as the second layer from the top, and meanwhile, in Example 1, to supplement this, the glass component is supplied from the glass ceramic layer 13 as the third layer from the top to the ceramic green sheet 12 as the second layer from the top. Accordingly, when the glass ceramic green sheet 12 performs the function of supplying sufficient glass component, glass concentration of the ceramic layer 2 stacked on the principal surface side of the substrate relative to the glass ceramic layer 3 is higher than the glass concentration of the ceramic layer 2 stacked on an inner side of the substrate relative to the glass ceramic layer 3.

As described above, according to the present invention, it has been found that sufficient glass component can be contained in the ceramic layer in the vicinity of the principal surface of the multilayer ceramic substrate.

Experimental Example 2

Multilayer ceramic substrates according to Examples 2-1 to 2-6 and multilayer ceramic substrates according to Comparative Examples 3 to 6 were produced in the following manner.

First, a plurality of the ceramic green sheets 12, the glass ceramic slurry, the conductive paste, and a plurality of the constraining-layer green sheets 18 used in the embodiment were prepared.

The ceramic green sheet 12 had planar dimensions 50 mm in length and 50 mm in width. For the ceramic green sheet 12, a plurality of types of ceramic green sheets 12 having different thicknesses, for example, a ceramic green sheet having a thickness of 10 μm and a ceramic green sheet having a thickness of 20 μm, were prepared.

The constraining-layer green sheet 18 had planar dimensions of 50 mm in length and 50 mm in width. The thickness of the constraining-layer green sheet 18 was 100 μm.

The glass ceramic slurry was applied onto the entire surface of one of the principal surfaces of a predetermined ceramic green sheet 12 by a doctor blade method to form a glass ceramic layer 13 having a thickness of 4 μm (in the description of the manufacturing method of the embodiment, the upper glass ceramic layer is indicated by reference numeral 13a, and the lower glass ceramic layer is indicated by reference numeral 13b; however, in the following description, in order to avoid complication of explanation, both the glass ceramic layers are collectively indicated by reference numeral 13).

On the other hand, a conductive paste was applied onto one of the principal surfaces of the predetermined ceramic green sheet 12 in a square shape with a length of 2 mm and a width of 2 mm so as to have a thickness of 20 μm, thus forming a conductive paste film 16.

For some of the ceramic green sheets 12 each having the glass ceramic layer 13 on its principal surface, a conductive paste was applied onto one of the principal surfaces of the formed glass ceramic layer 13 in a square shape with a length of 2 mm and a width of 2 mm so as to have a thickness of 20 μm, thus forming the conductive paste film 16.

Those conductive paste films 16 are used for forming a surface electrode 6 for measuring the electrode bonding strength on the principal surface of the completed multilayer ceramic substrate.

Using these materials, unfired laminates 11 of Examples 2-1 to 2-6 were first produced.

The unfired laminates 11 of Examples 2-1 to 2-6 each have a multilayer structure of the constraining-layer green sheet 18, the conductive paste film 16, the ceramic green sheet 12, the lower glass ceramic layer 13, the ceramic green sheet 12, the upper glass ceramic layer 13, the ceramic green sheet 12, the conductive paste film 16, and the constraining-layer green sheet 18 stacked in this order from the bottom.

The unfired laminates 11 of Examples 2-1 to 2-6 are produced to have different distances from the principal surface from which the constraining-layer green sheet 18 is removed (hereinafter the same) to the glass ceramic layer 13 by using the ceramic green sheets 12 having different thicknesses. Table 2 shows the distance from the principal surface to the glass ceramic layer 3 of each of the laminates 1 after firing. The distance from the principal surface to the glass ceramic layer 3 means the distance from the principal surface to a surface on a side closer to a principal surface of the glass ceramic layer 3.

TABLE 2

| | Distance from principal surface to glass ceramic layer (After firing) (μm) | Electrode bonding strength (N/2 mm square) | Flexural strength (MPa) |
|---|---|---|---|
| Comparative Example 3 | 0 | 45 | 300 |
| Example 2-1 | 10 | 85 | 310 |
| Example 2-2 | 20 | 95 | 305 |
| Example 2-3 | 30 | 90 | 315 |
| Example 2-4 | 40 | 90 | 310 |
| Example 2-5 | 50 | 85 | 305 |
| Example 2-6 | 100 | 80 | 300 |
| Comparative Example 4 | 150 | 45 | 250 |
| Comparative Example 5 | — | 45 | 250 |
| Comparative Example 6 | — | 45 | 250 |

Then, the unfired laminate 11 of Comparative Example 3 was produced.

In the unfired laminate 11 of Comparative Example 3, the position of the glass ceramic layer 13 is different from that in the unfired laminates 11 of Examples 2-1 to 2-6. That is, in the unfired laminate 11 of Comparative Example 3, the glass ceramic layers 13 having the conductive paste film 16 on its principal surface were stacked on both principal surfaces of the laminate. Accordingly, in the unfired laminate 11 of Comparative Example 3, the distance from the principal surface to the glass ceramic layer 13 is 0 μm.

Then, the unfired laminate 11 of Comparative Example 4 was produced.

Although the unfired laminate 11 of Comparative Example 4 has the same basic layered structure as the unfired laminates 11 of Examples 2-1 to 2-6, the distance from the principal surface to the glass ceramic layer 3 was increased to 150 μm (after firing).

The unfired laminates 11 of Examples 2-1 to 2-6, Comparative Example 3, and Comparative Example 4 are each produced such that the total thickness of the plurality of ceramic green sheets 12 is 1000 μm, and the total thickness of the two glass ceramic layers 13 is 8 μm.

Then, the unfired laminates 11 of Comparative Examples 5 and 6 were produced. The unfired laminate 11 of Comparative Example 5 and the unfired laminate 11 of Comparative Example 6 have the common constituents.

In addition, the unfired laminates 11 of Comparative Examples 5 and 6 each have a structure similar to that of the unfired laminate disclosed in Patent Document (Japanese Patent No. 5,024,064).

First, 48 ceramic green sheets 12 each having a thickness of 20 μm and having a 4 μm-thick glass ceramic layer 13 on its principal surface were prepared. Further, two ceramic green sheets 12 each having a thickness of 20 μm, having a 4 μm-thick glass ceramic layer 13 on its principal surface, and further having a conductive paste film 16 on its surface were prepared.

Then, using these materials, one ceramic green sheet 12 having the glass ceramic layer 13 and the conductive paste film 16 on its principal surface with the conductive paste film 16 side facing downward, 24 ceramic green sheets 12 having the glass ceramic layer 13 on its principal surface with the glass ceramic layer 13 side facing downward, 24 ceramic green sheets 12 having the glass ceramic layer 13 on its principal surface with the glass ceramic layer 13 side facing upward, and one ceramic green sheet 12 having the glass ceramic layer 13 and the conductive paste film 16 on its principal surface with the conductive paste film 16 side facing upward were stacked in that order from the bottom, thus obtaining the unfired laminate 11 of Comparative Example 5. In the unfired laminate 11 of Comparative Example 6, the constraining-layer green sheet 18 was further stacked on each of the upper and lower sides of the unfired laminate 11 of Comparative Example 5.

Then, the unfired laminates 11 of Examples 2-1 to 2-6 and Comparative Examples 3 to 6 were fired.

The unfired laminates 11 of Examples 2-1 to 2-6 and Comparative Examples 3, 4, and 6 were fired under the same conditions as in Embodiment 1 while being vertically pressurized.

The unfired laminate 11 of Comparative Example 5 was fired under the same conditions as in Embodiment 1 without being pressurized.

Then, a Ni plating film and an Au plating film were formed on the surface of the surface electrode 6 of each of the fired laminates 1 thus obtained, and the multilayer ceramic substrates of Examples 2-1 to 2-6 and Comparative Examples 3 to 6 were completed.

Then, the electrode bonding strength and the flexural strength were measured for each of the multilayer ceramic substrates of Examples 2-1 to 2-6 and Comparative Examples 3 to 6.

The electrode bonding strength was measured with a tensile strength tester by soldering a lead terminal to the surface electrode 6 (with the Ni plating film and the Au plating film) formed on the principal surface of each multilayer ceramic substrate.

The flexural strength was measured with a 3-point bending tester.

Table 2 shows the electrode bonding strength and the flexural strength of each multilayer ceramic substrate.

As can be seen from Table 2, in the multilayer ceramic substrates according to Examples 2-1 to 2-6 having the glass ceramic layer in which after firing, the entire or a portion of the thickness exists inside the laminate and within 100 μm from the principal surface, good results were obtained for both the electrode bonding strength and the flexural strength.

On the other hand, in Comparative Example 3 in which the glass ceramic layer was formed on a surface portion of the principal surface of the laminate, although the flexural strength was good, the electrode bonding strength decreased.

In the multilayer ceramic substrate according to Comparative Example 4 in which after firing, the glass ceramic layer was formed at a distance of more than 100 from the principal surface of the laminate, the electrode bonding strength decreased, and the flexural strength slightly decreased.

In the multilayer ceramic substrate according to Comparative Example 5 obtained by inserting the glass ceramic layer as the constraining layer between the ceramic green sheets and fired without being pressurized, and the multilayer ceramic substrate according to Comparative Example 6 fired under pressure, the electrode bonding strength decreased, and the flexural strength slightly decreased.

As described above, according to the present invention, it has been found that the electrode bonding strength between the multilayer ceramic substrate and the surface electrode can be increased, and the flexural strength of the multilayer ceramic substrate can be enhanced.

Experimental Example 3

Multilayer ceramic substrates according to Examples 3-1 to 3-7 and multilayer ceramic substrates according to Comparative Example 7 were produced in the following manner.

In Examples 3-1 to 3-7, the thickness of the constraining-layer green sheets 18 stacked on the upper and lower sides of the unfired laminate 11 was changed. That is, before firing, the thickness of the constraining-layer green sheet 18 was changed to 2 μm, 10 μm, 25 μm, 50 μm, 100 μm, 200 μm, and 300 μm.

On the other hand, in Comparative Example 7, the constraining-layer green sheets 18 were not stacked on the upper and lower sides.

Table 3 shows the thicknesses of the constraining-layer green sheets 18 of Examples 3-1 to 3-7.

TABLE 3

| | Thickness of constraining-layer green sheet (Before firing) (μm) | Electrode bonding strength (N/2 mm square) | Flexural strength (MPa) | Remarks |
|---|---|---|---|---|
| Comparative Example 7 | None | — | — | Crack |
| Example 3-1 | 2 | — | — | Crack |
| Example 3-2 | 10 | 85 | 300 | |
| Example 3-3 | 25 | 90 | 305 | |
| Example 3-4 | 50 | 90 | 305 | |
| Example 3-5 | 100 | 85 | 305 | |
| Example 3-6 | 200 | 85 | 305 | |
| Example 3-7 | 300 | 85 | 305 | |

First, the unfired laminate 11 of each Example and Comparative Example was produced.

The unfired laminate 11 of each Example has a multilayer structure of one constraining-layer green sheet 18 having a predetermined thickness, one 20 μm-thick ceramic green sheet 12 having the conductive paste film 16 with the conductive paste film 16 side facing downward, one 20 thick ceramic green sheet 12 having the 4 μm-thick glass ceramic layer 13 with the glass ceramic layer 13 side facing downward, 46 plain 20 μm-thick ceramic green sheets 12, one 20 μm-thick ceramic green sheet 12 having the 4 μm-thick glass ceramic layer 13 with the glass ceramic layer 13 side facing upward, one 20 μm-thick ceramic green sheet 12 having the conductive paste film 16 with the conductive paste film 16 side facing upward, and one constraining-layer green sheet 18 having a predetermined thickness, which are stacked in this order from the bottom.

The unfired laminate 11 of Comparative Example is one in which the upper and lower constraining-layer green sheets 18 are removed from the unfired laminate 11 of Example.

Then, the unfired laminates 11 of Examples 3-1 to 3-7 and Comparative Example 7 were fired.

The unfired laminates 11 of Examples 3-1 to 3-7 were fired under the same conditions as in Embodiment 1 while being vertically pressurized by a pressing jig with the constraining-layer green sheet 18 interposed therebetween.

The unfired laminate 11 of Comparative Example 7 was vertically pressurized directly by a pressing jig and fired under the same conditions as in Embodiment 1.

As a result, cracks occurred in the laminate of Comparative Example 7 in which the constraining-layer green sheet 18 was not stacked and the laminate of Example 3-1 in which the 2 μm-thick constraining-layer green sheet 18 was stacked.

For each of the laminates of Example 3-2 to 3-7 in which no cracks occurred, a Ni plating film and an Au plating film were formed on the surface of the surface electrode 6 to complete each multilayer ceramic substrate.

Table 3 shows the electrode bonding strength and the flexural strength of each completed multilayer ceramic substrate.

As can be seen from Table 3, good electrode bonding strength and flexural strength were obtained in all the multilayer ceramic substrates of Examples 3-2 to 3-7.

As described above, in order to obtain good electrode bonding strength, flexural strength, and appearance shape, it has been found that it is necessary to stack the constraining-layer green sheets 18 on the upper and lower sides of the unfired laminate 11 and fire the unfired laminate 11 while the unfired laminate 11 is vertically pressurized. In addition, it has been found that it is not sufficient if the thickness of the constraining-layer green sheet 18 is 2 μm, and the thickness is preferably not less than 10 μm.

Experimental Example 4

Multilayer ceramic substrates according to Examples 4-1 to 4-8 were produced in the following manner.

In Experimental Example 4, the thickness of the glass ceramic layer 13 was changed for each of Examples 4-1 to 4-8, and the influence was investigated.

Table 4 shows the thicknesses of the glass ceramic layers 13 of Examples 4-1 to 4-8.

The order of stacking in the unfired laminate 11 is all the same, and the unfired laminate 11 has a multilayer structure of one constraining-layer green sheet 18 having a thickness of 100 μm, one 20 μm-thick ceramic green sheet 12 having the conductive paste film 16 with the conductive paste film 16 side facing downward, one 20 μm-thick ceramic green sheet 12 having the glass ceramic layer 13, having a predetermined thickness, with the glass ceramic layer 13 side facing downward, 46 plain 20 μm-thick ceramic green sheets 12, one 20 μm-thick ceramic green sheet 12 having the glass ceramic layer 13, having a predetermined thickness, with the glass ceramic layer 13 side facing upward, one 20 μm-thick ceramic green sheet 12 having the conductive paste film 16 with the conductive paste film 16 side facing upward, and one constraining-layer green sheet 18 having a thickness of 100 μm, which are stacked in this order from the bottom.

Then, each of the unfired laminates 11 was fired under the same conditions as in Embodiment 1 while being pressurized.

Then, a Ni plating film and an Au plating film were formed on the surface of the surface electrode 6 of each of the fired laminates 1 thus obtained, and the multilayer ceramic substrates of Examples 4-1 to 4-7 and Comparative Example 8 were completed.

As described above, Table 4 shows the thickness of each of the glass ceramic layers 13. In addition to this, Table 4 shows a ratio (%) of the total thickness of the glass ceramic layer 13 to the thickness of the laminate in each of the completed multilayer ceramic substrates after firing in each of Examples 4-1 to 4-8.

For example, in Example 4-7, since 50 ceramic green sheets 12 each having a thickness of 20 μm and two glass ceramic layers 13 each having a thickness of 30 μm are stacked to produce a multilayer ceramic substrate having a multilayer structure of 50 ceramic layers each having a thickness of 10 μm and two glass ceramic layers 3 each having a thickness of 15 μm, the ratio is (15×2)/(10×50+15×2) 5.66%.

In Example 4-8, since 50 ceramic green sheets 12 each having a thickness of 20 μm and two glass ceramic layers 13 each having a thickness of 40 μm are stacked to produce a multilayer ceramic substrate having a multilayer structure of 50 ceramic layers each having a thickness of 10 μm and two glass ceramic layers 3 each having a thickness of 20 μm, the ratio is (20×2)/(10×50+20×2)≈7.41%.

Table 4 shows the electrode bonding strength and the flexural strength of each completed multilayer ceramic substrate.

TABLE 4

|  | Thickness of glass ceramic layer (Before firing) (μm) | Thickness of glass ceramic layer/thickness of laminate (After firing) (%) | Electrode bonding strength (N/2 mm square) | Flexural strength (MPa) |
|---|---|---|---|---|
| Example 4-1 | 0.5 | 0.10 | 45 | 250 |
| Example 4-2 | 1 | 0.20 | 85 | 310 |
| Example 4-3 | 2 | 0.40 | 95 | 305 |
| Example 4-4 | 5 | 0.99 | 95 | 315 |
| Example 4-5 | 10 | 1.96 | 95 | 310 |
| Example 4-6 | 20 | 3.85 | 95 | 305 |
| Example 4-7 | 30 | 5.66 | 95 | 300 |
| Example 4-8 | 40 | 7.41 | 45 | 200 |

As can be seen from Table 4, in the multilayer ceramic substrates according to Examples 4-2 to 4-7 using the glass ceramic layer 13 having a thickness of 1 μm to 30 μm, good results were obtained for both the electrode bonding strength and the flexural strength. In particular, in Example 4-7, the glass ceramic layer 13 had a thickness of 30 μm, and the ratio of the thickness of the glass ceramic layer 3 to the total thickness of the laminate 1 was as relatively large as 5.66%; however, good electrode bonding strength and flexural strength were obtained.

On the other hand, in Example 4-1 in which the glass ceramic layer 13 had a thickness of 0.5 μm, both the flexural strength and the electrode bonding strength decreased. It is considered that the thickness of a glass ceramic green sheet 23 is small and the supply amount of the glass component is insufficient.

In Example 4-8 in which the glass ceramic layer 13 had a thickness of 40 μm, both the flexural strength and the electrode bonding strength decreased. It is considered that the ratio of the thickness of the glass ceramic layer 3 to the total thickness of the laminate 1 was as too large as 7.41%, and the flexural strength and the electrode bonding strength decreased.

As described above, it has been found that when the ratio of the thickness of the glass ceramic layer 3 to the total thickness of the laminate 1 is about not more than 6%, good electrode bonding strength and flexural strength can be obtained.

Experimental Example 5

In Experimental Example 5, the influence of the total number of the glass ceramic layers 3 inside the laminate 1 on the insulation resistance of the laminate 1 (ceramic layer 2) was investigated.

Multilayer ceramic substrates according to Examples 5-1 to 5-15 having the following contents were produced. Unless otherwise specified, the manufacturing method in each example was performed by the manufacturing method described in the embodiment.

In each example, the laminate 1 is provided with the glass ceramic layers 3 whose number is selected from any of 2, 4, 6, 8, and 10. In each example, one of these glass ceramic layers 3 was disposed such that the entire thickness existed within 100 μm from one principal surface, and the other one was disposed such that the entire thickness existed within 100 μm from the other principal surface. When the total number of the glass ceramic layers 3 is not less than four, the remaining glass ceramic layers 3 are arranged at equal intervals between the two glass ceramic layers 3 arranged within 100 μm from the principal surface described above.

In each example, the laminate 1 is provided with the ceramic layers 2 whose number is selected from any of 10, 40, and 80.

In each example, the thickness of each of the glass ceramic layers 3 was 2 μm (4 μm at the stage of the glass ceramic layer 13 before firing). The thickness of the ceramic layer was 10 μm (20 μm at the stage of the ceramic green sheet 12).

In each example, the internal electrode 4 and an external electrode for measuring the insulation resistance were formed. Specifically, the conductive paste film 14 mainly composed of Cu was applied onto each principal surface of the two green sheets 12 for the ceramic 2 arranged adjacent to the vicinity of the middle in the stacking direction of the laminate 1, and a pair of the internal electrodes 4 was formed. A conductive paste film mainly composed of Cu was applied to both ends of the fired laminate 1 and baked to form a pair of external electrodes. Each of the pair of the internal electrodes 4 is connected to one of the pair of external electrodes.

Each of the multilayer ceramic substrates according to Examples 5-1 to 5-15 was subjected to a test at a load of 100 V for 1000 hours under the conditions of a temperature of 85° C. and a humidity of 85%. After the test, the insulation resistance between the external electrodes of each example was measured.

Table 5 shows the insulation resistance (Ω (common logarithm)) of each of Examples 5-1 to 5-15.

TABLE 5

|  | Total number of glass ceramic layers | Total number of ceramic layers | Insulation resistance (Ω (common logarithm)) |
|---|---|---|---|
| Example 5-1 | 2 | 10 | 12 |
| Example 5-2 |  | 40 | 12 |

TABLE 5-continued

| | Total number of glass ceramic layers | Total number of ceramic layers | Insulation resistance (Ω (common logarithm)) |
|---|---|---|---|
| Example 5-3 | | 80 | 12 |
| Example 5-4 | 4 | 10 | 12 |
| Example 5-5 | | 40 | 12 |
| Example 5-6 | | 80 | 12 |
| Example 5-7 | 6 | 10 | 12 |
| Example 5-8 | | 40 | 12 |
| Example 5-9 | | 80 | 12 |
| Example 5-10 | 8 | 10 | 8 |
| Example 5-11 | | 40 | 8 |
| Example 5-12 | | 80 | 8 |
| Example 5-13 | 10 | 10 | 6 |
| Example 5-14 | | 40 | 6 |
| Example 5-15 | | 80 | 6 |

As can be seen from Table 5, the total number of the glass ceramic layers 3 inside the laminate 1 influenced the insulation resistance of the laminate 1 (ceramic layer 2). On the other hand, the total number of the ceramic layers 2 inside the laminate 1 did not influence the insulation resistance of the laminate 1 (ceramic layer 2).

Specifically, when the total number of the glass ceramic layers 3 inside the laminate 1 is one of 2, 4, and 6, regardless of the total number of the ceramic layers 2, the insulation resistance was 12Ω. On the other hand, when the total number of the glass ceramic layers 3 inside the laminate 1 is 8, regardless of the total number of the ceramic layers 2, the insulation resistance decreased to 8Ω. Further, when the total number of the glass ceramic layers 3 inside the laminate 1 is 10, regardless of the total number of the ceramic layers 2, the insulation resistance further decreased to 6Ω.

The inventor of the present invention is studying detailed mechanisms. When the total number of the glass ceramic layers 3 is more than six, evaporation of a binder contained in the ceramic green sheet 12 and a binder contained in the glass ceramic layer 13 is hindered during firing, and the binder is likely to remain in the layer. It is considered that after firing, the binder in the layer gradually volatilizes to thereby cause defects, so that the insulation resistance decreases.

As described above, in order to maintain high insulation resistance, it has been found that the total number of the glass ceramic layers 3 inside the laminate 1 should be set to not more than six. In this example, a mode in which the glass ceramic layer exists in a region away from the principal surface of the laminate by more than 100 μm was described. However, even though all glass ceramic layers exist within 100 μm from the principal surface of the laminate, it is considered that such a tendency that the insulation resistance is less likely to decrease when the total number of the glass ceramic layers 13 is not more than six does not change.

DESCRIPTION OF REFERENCE SYMBOLS

1: laminate
2: ceramic layer
3a, 3b: glass ceramic layer
4: internal electrode
5: via electrode
6: surface electrode
7: electronic component
11: unfired laminate
12: ceramic green sheet
13a, 13b: glass ceramic layer (before firing)
14, 16: conductive paste film
15: holes (for formation of via electrodes 5)
18: constraining layer (constraining-layer ceramic green sheet)
19: pressing jig
25: conductive paste (filled in hole 15)
100: multilayer ceramic substrate
200: electronic module.

The invention claimed is:

1. A multilayer ceramic substrate comprising:
a laminate having a plurality of stacked ceramic layers, an internal electrode disposed between predetermined layers of the plurality of ceramic layers,
wherein the ceramic layers comprise a ceramic material having a main component containing 48 to 75% by weight of Si, 20 to 40% by weight of Ba, and 10 to 40% by weight of Al, and an auxiliary component containing at least 2.5 to 20 parts by weight of Mn with respect to 100 parts by weight of the main component;
a first glass ceramic layer in the laminate, wherein at least a portion of a thickness of the first glass ceramic layer exists within 100 μm inside of the laminate measured from a first principal surface of the laminate, and wherein the first glass ceramic layer comprises a material containing a glass component mainly composed of BaO—$Al_2O_3$—$SiO_2$—$B_2O_3$—CaO and $Al_2O_3$; and
a second glass ceramic layer in the laminate, wherein at least a portion of a thickness of the second glass ceramic layer exists within 100 μm inside of the laminate measured from a second principal surface of the laminate, the second principal surface opposing the first principal surface, and
wherein a first glass concentration of a first ceramic layer of the plurality of stacked ceramic layers between the first principal surface of the laminate and the first glass ceramic layer and a second glass concentration of a second ceramic layer of the plurality of stacked ceramic layers between the second principal surface of the laminate and the second glass ceramic layer are higher than a third glass concentration of a third ceramic layer of the plurality of stacked ceramic layers between the first glass ceramic layer and the second glass ceramic layer.

2. The multilayer ceramic substrate according to claim 1, wherein the first glass ceramic layer includes no more than six layers.

3. The multilayer ceramic substrate according to claim 2, wherein the first glass ceramic layer is one or two layers.

4. The multilayer ceramic substrate according to claim 1, wherein a total number of layers of the first glass ceramic layer and the second glass ceramic layer is no more than six.

5. The multilayer ceramic substrate according to claim 1, wherein the first glass ceramic layer and the second glass ceramic layer each include one layer.

6. The multilayer ceramic substrate according to claim 1, wherein the first glass ceramic layer and the second glass ceramic layer each comprise a material containing a glass component mainly composed of BaO—$Al_2O_3$—$SiO_2$—$B_2O_3$—CaO and $Al_2O_3$.

* * * * *